(12) United States Patent
Kim et al.

(10) Patent No.: US 10,707,639 B2
(45) Date of Patent: Jul. 7, 2020

(54) LASER BEAM STEERING DEVICE AND SYSTEM INCLUDING THE SAME

(71) Applicant: SAMSUNG ELECTRONICS CO., LTD., Suwon-si (KR)

(72) Inventors: Sunil Kim, Osan-si (KR); Duhyun Lee, Yongin-si (KR); Changbum Lee, Seoul (KR); Byounglyong Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 107 days.

(21) Appl. No.: 15/681,724

(22) Filed: Aug. 21, 2017

(65) Prior Publication Data
US 2018/0062341 A1 Mar. 1, 2018

(30) Foreign Application Priority Data
Aug. 29, 2016 (KR) .................. 10-2016-0110095

(51) Int. Cl.
*H01S 3/00* (2006.01)
*G02F 1/29* (2006.01)
*H01S 5/00* (2006.01)

(52) U.S. Cl.
CPC ............. *H01S 3/0071* (2013.01); *G02F 1/29* (2013.01); *G02F 1/292* (2013.01); *H01S 3/0078* (2013.01); *H01S 5/0071* (2013.01); *H01S 5/0078* (2013.01); *G02F 2201/34* (2013.01); *G02F 2202/10* (2013.01); *G02F 2202/36* (2013.01); *G02F 2203/055* (2013.01); *G02F 2203/24* (2013.01)

(58) Field of Classification Search
CPC ...................................................... G02F 1/292
See application file for complete search history.

(56) References Cited

U.S. PATENT DOCUMENTS

| | | | |
|---|---|---|---|
| 8,674,792 B2 | 3/2014 | Yonak et al. | |
| 8,711,463 B2 | 4/2014 | Han et al. | |
| 8,908,251 B2 | 12/2014 | Sayyah et al. | |
| 2010/0226027 A1 | 9/2010 | Kohlstrand | |

(Continued)

FOREIGN PATENT DOCUMENTS

| | | |
|---|---|---|
| JP | 2013-183012 A | 9/2013 |
| KR | 10-2012-0077417 A | 7/2012 |
| WO | 02/079871 A2 | 10/2002 |

OTHER PUBLICATIONS

Atwater et al, Tunable Metaphotonic Materials, Feb. 2014, Cal Tech, pp. 1-10.*

(Continued)

*Primary Examiner* — Tony Ko
(74) *Attorney, Agent, or Firm* — Sughrue Mion, PLLC

(57) ABSTRACT

A laser beam steering device and a system including the laser beam steering device are provided. The laser beam steering device includes a refractive index change layer having a refractive index that changes based on an electrical signal; at least one antenna pattern disposed above the refractive index change layer; a wavelength selection layer disposed under the refractive index change layer and configured to correspond to a wavelength of a laser beam incident onto the laser beam steering device; and a driver configured to apply the electrical signal to the refractive index change layer.

35 Claims, 13 Drawing Sheets

(56) References Cited

U.S. PATENT DOCUMENTS

2016/0103341 A1 4/2016 Long et al.
2016/0223723 A1 8/2016 Han et al.

OTHER PUBLICATIONS

Communication dated Feb. 8, 2018, issued by the European Patent Office in counterpart European application No. 17181273.8.
Wei, et al., "Highly efficient beam steering with a transparent metasurface", 2013, Optics Express, Vo. 21, Issue No. 9, 7 pages total.

* cited by examiner

LASER BEAM STEERING DEVICE AND SYSTEM INCLUDING THE SAME

CROSS-REFERENCE TO RELATED APPLICATION

This application claims priority from Korean Patent Application No. 10-2016-0110095, filed on Aug. 29, 2016 in the Korean Intellectual Property Office, the disclosure of which is incorporated herein by reference in its entirety.

BACKGROUND

1. Field

Exemplary embodiments relate to a laser beam steering device and a system including the laser beam steering device.

2. Description of the Related Art

In order to steer a laser beam to a desired position, a method of mechanically rotating a laser irradiation portion and an optical phased array (OPA) method, which uses interference of a bundle of laser beams emitted from a plurality of unit cells or waveguides, have been generally used. In the OPA method, a laser beam may be steered by electrically or thermally controlling the unit cells or waveguides. The method of mechanically rotating a laser irradiation portion adopts a motor or a micro electro mechanical system (MEMS) so that the volume of a system may be increased and manufacturing costs may be raised.

SUMMARY

Exemplary embodiments address at least the above problems and/or disadvantages and other disadvantages not described above. Also, the exemplary embodiments are not required to overcome the disadvantages described above, and may not overcome any of the problems described above.

One or more exemplary embodiments provide methods and apparatuses for laser beam steering device and a system including the laser beam steering device.

According to an aspect of an exemplary embodiment, there is provided a laser beam steering device including: a refractive index change layer having a refractive index that changes based on an electrical signal; at least one antenna pattern disposed above the refractive index change layer; a wavelength selection layer disposed under the refractive index change layer and configured to correspond to a wavelength of a laser beam incident onto the laser beam steering device; and a driver configured to apply the electrical signal to the refractive index change layer.

The wavelength selection layer may have a carrier density corresponding to a resonance wavelength of the laser beam.

The wavelength selection layer may have a carrier density different from a carrier density of the refractive index change layer.

The carrier density of the wavelength selection layer may be lower than the carrier density of the refractive index change layer.

The wavelength selection layer may have a composition different from a composition of the refractive index change layer.

The refractive index change layer may have a single layer structure or a multilayer structure.

The wavelength selection layer may have a single layer structure or a multilayer structure.

The refractive index change layer and the wavelength selection layer may include oxide semiconductor.

The oxide semiconductor may include at least one of indium-tin-oxide (ITO), indium-zinc-oxide (IZO), Ga—In—Zn—oxide (GIZO), Al—Zn-oxide (AZO), Ga—Zn-oxide (GZO), and ZnO ITO(Indium-Tin-Oxide), IZO (Indium-Zinc-Oxide), GIZO(Ga—In—Zn-Oxide), AZO (Al—Zn-Oxide), GZO(Ga—Zn-Oxide), and ZnO.

The refractive index change layer may have a thickness of about 5 nm or less.

The laser beam steering device may further include an insulating layer that is disposed between the refractive index change layer and the at least one antenna pattern.

The insulating layer may include a material having resistance of about 1 MΩ or more.

The laser beam steering device may further include a metal mirror layer that is disposed under the wavelength selection layer.

The laser beam steering device may further include an insulating layer that is disposed between the wavelength selection layer and the metal mirror layer.

The at least one antenna pattern may include at least one of Ag, Au, Al, Pt, TiN, and TaN.

The at least one antenna pattern may have a multilayer structure.

According to an aspect of another exemplary embodiment, there is provided a laser beam steering device including: a refractive index change layer having a refractive index that changes based on an electrical signal; at least one antenna pattern disposed above the refractive index change layer; a wavelength selection layer disposed under the refractive index change layer and configured to correspond to a wavelength of a laser beam incident onto the laser beam steering device; and a unit cell driver configured to apply an electrical signal to the refractive index change layer.

The plurality of unit cells may be arranged in two dimensions.

The plurality of unit cells may form a refractive index profile that varies according to time so that the laser beam is steered.

The wavelength selection layer may have a carrier density corresponding to a resonance wavelength of the laser beam.

The carrier density of the wavelength selection layer may be lower than the carrier density of the refractive index change layer.

Each of the refractive index change layer and the wavelength selection layer may have either a single layer structure or a multilayer structure.

The laser beam steering device may further include an insulating layer that is disposed between the refractive index change layer and the at least one antenna pattern.

The laser beam steering device may further include a metal mirror layer that is disposed under the wavelength selection layer.

The laser beam steering device may further include an insulating layer that is disposed between the wavelength selection layer and the metal mirror layer.

The at least one antenna pattern may have a multilayer structure.

According to an aspect of another exemplary embodiment, there is provided a system including: a laser light source configured to emit a laser beam to an object; a laser beam steering device configured to steer the laser beam emitted from the laser light source; and a detector configured to detect a laser beam returning from the object, wherein the laser beam steering device comprises a plurality of unit cells, each of the unit cells comprising: a refractive index change layer having a refractive index that changes based on an electrical signal; at least one antenna pattern disposed above the refractive index change layer; a wavelength selection layer disposed under the refractive index change layer and configured to correspond to a wavelength of a laser beam; and a unit cell driving unit applying an electrical signal to the refractive index change layer.

The plurality of unit cells may be arranged in two dimensions and form a refractive index profile that varies according to time so that the laser beam is steered.

The wavelength selection layer may have a carrier density corresponding to a resonance wavelength of the laser beam.

Each of the refractive index change layer and the wavelength selection layer may have either a single layer structure or a multilayer structure.

The laser beam steering device may further include an insulating layer that is provided between the refractive index change layer and the at least one antenna pattern.

The laser beam steering device may further include a metal mirror layer that is provided under the wavelength selection layer.

The at least one antenna pattern may have a multilayer structure.

According to an aspect of another exemplary embodiment, there is provided a laser beam steering device including: an insulation layer; an antenna pattern disposed on an upper surface of the insulation layer; a driver configured to generate an electrical signal; a first active layer and a second active layer which are disposed between a lower surface of the insulation layer and the driver; wherein: the first active layer is disposed closer to the insulation layer in comparison with the second active layer, has a carrier density higher than a carrier density of the second active layer, and changes a refractive index of the first active layer according to a voltage of the electrical signal; and the second active layer resonates at a wavelength of a laser beam which is input to the laser beam steering device.

BRIEF DESCRIPTION OF THE DRAWINGS

The above and/or other aspects will be more apparent by describing certain exemplary embodiments, with reference to the accompanying drawings, in which.

DETAILED DESCRIPTION

Figure 1:
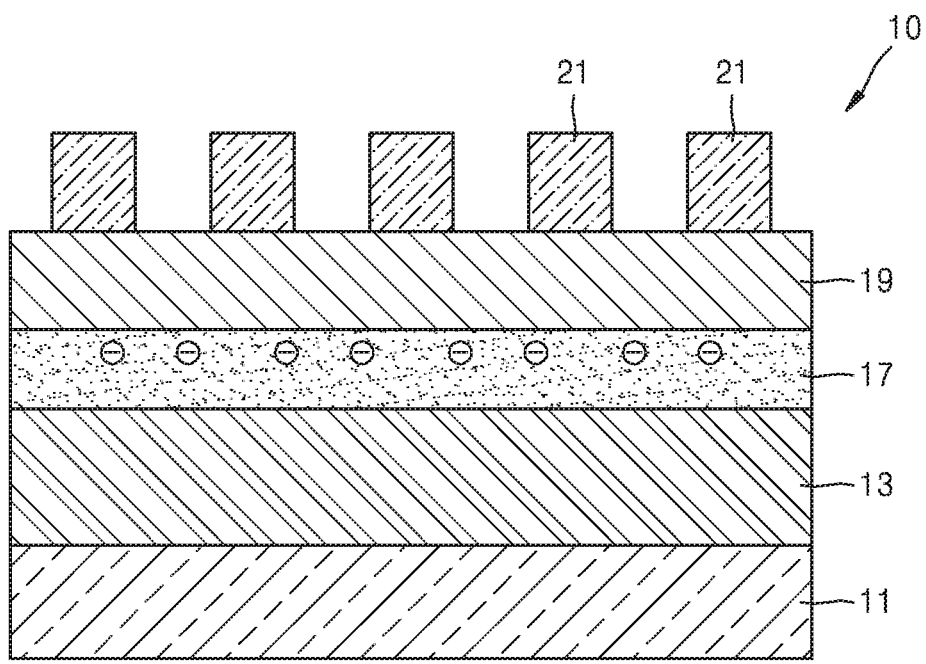
FIG. 1 is a cross-sectional view of a general laser beam steering device.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

In a laser beam steering device using an optical phased array (OPA) method, a laser beam may be steered by changing a carrier density by applying an electrical signal such as a voltage to a refractive index change layer.

FIG. 1 is a cross-sectional view of a general laser beam steering device 10. In FIG. 1, only one of a plurality of unit cells forming the general laser beam steering device 10 is illustrated for convenience of explanation.

Referring to FIG. 1, the laser beam steering device 10 includes a unit cell driving unit 11, a metal mirror layer 13, a refractive index change layer 17, an insulating layer 19, and a plurality of antenna patterns 21, which are stacked in the enumerated order. The plurality of antenna patterns 21 is disposed on the insulating layer 19, and the insulating layer 19 is disposed between the refractive index change layer 17 and the antenna patterns 21. The refractive index change layer 17 is disposed between the insulating layer 19 and the metal mirror layer 13. A refractive index of the refractive index change layer 17 is changed by an electrical signal. The metal mirror layer 13 is disposed between the refractive index change layer 17 and the unit cell driving unit 11. In the above structure, when the unit cell driving unit 11 applies a voltage to the refractive index change layer 17, a carrier density of the refractive index change layer 17 is changed and thus a refractive index of the refractive index change layer 17 is changed according to a change of the carrier density.

Figure 2A:
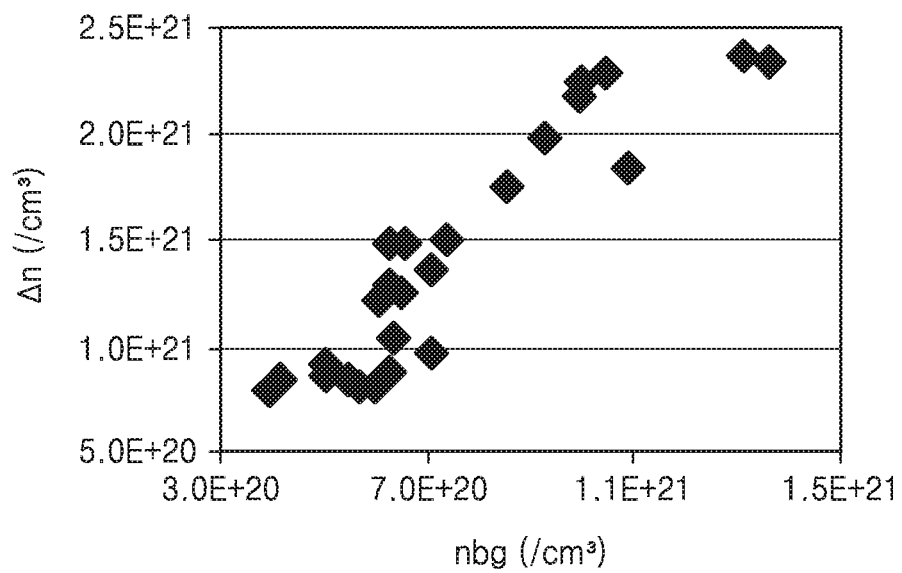
FIG. 2A is a graph showing a refractive index change efficiency according to a carrier density of a refractive index change layer in the general laser beam steering device of FIG. 1.
Figure 2B:
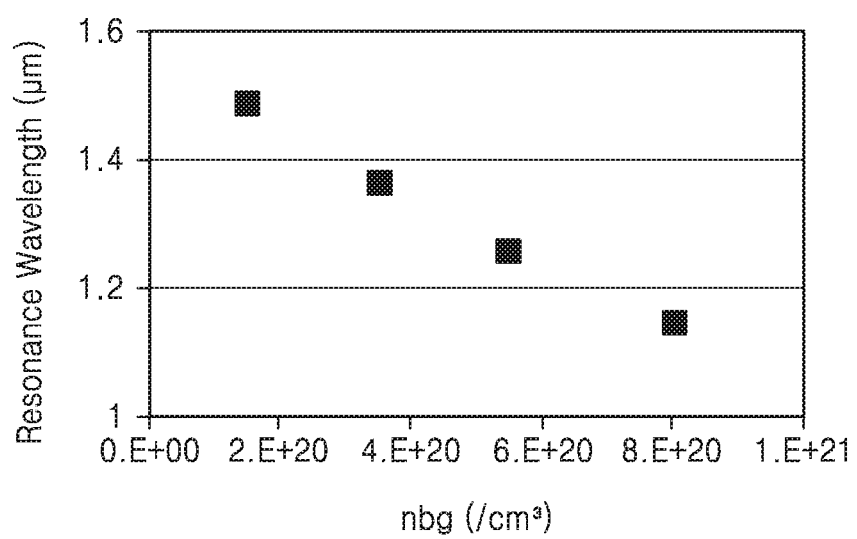
FIG. 2B is a graph showing a resonance wavelength according to the carrier density of the refractive index change layer in the general laser beam steering device of FIG. 1.

FIG. 2A is a graph showing a refractive index change efficiency according to the carrier density of the refractive index change layer 17 in the general laser beam steering device 10 of FIG. 1. In FIG. 2A, "nbg" denotes the carrier density of the refractive index change layer 17 and "An" denotes a change of the carrier density. The carrier density change "An" may be proportional to a refractive index change efficiency. FIG. 2B is a graph showing a resonance wavelength according to the carrier density of the refractive index change layer 17 in the general laser beam steering device 10 of FIG. 1.

Referring to FIGS. 2A and 2B, it may be seen that the wavelength of a laser beam and the refractive index change efficiency are determined by the carrier density of the refractive index change layer 17. As illustrated in FIG. 2A, it may be seen that, as the carrier density of the refractive index change layer 17 increases, the refractive index change efficiency increases. Accordingly, a high phase may be secured. However, as illustrated in FIG. 2B, as the carrier density of the refractive index change layer 17 increases, the wavelength of a laser beam that is usable decreases. For example, it may be difficult to use a laser beam having a resonance wavelength of about 1.4 μm or more. When a laser beam having a resonance wavelength of about 1.5 μm is in use, as illustrated in FIG. 2B, the carrier density of the refractive index change layer 17 is low. In this case, however, as the refractive index change efficiency also decreases, it is difficult to obtain a high phase. Furthermore, since application of a high voltage is needed to obtain a high phase, there may be a problem in stability of the general laser beam steering device 10.

Figure 3:
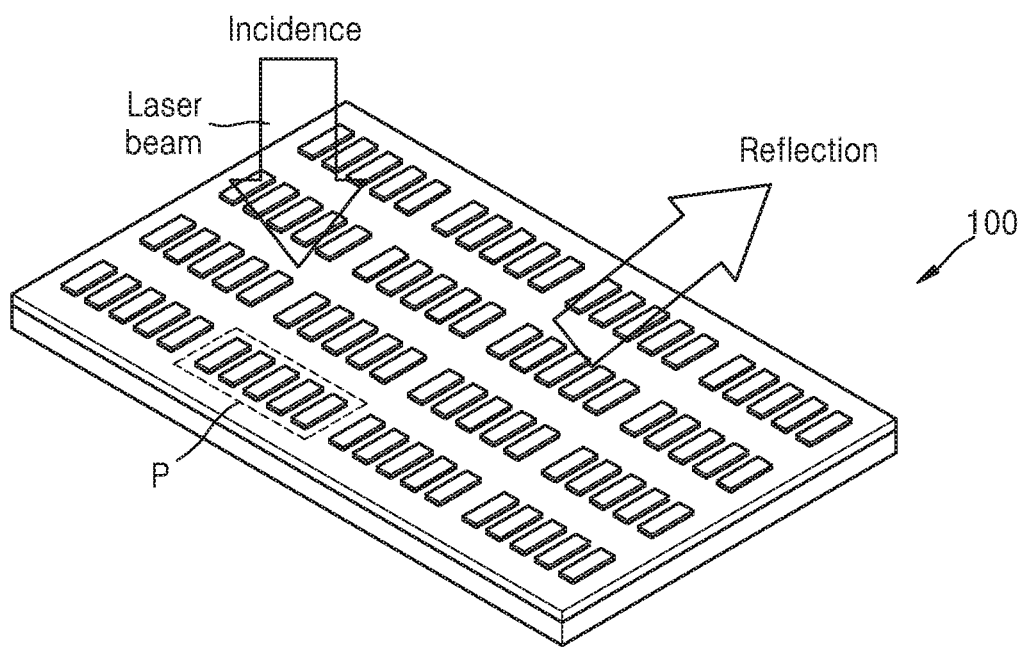
FIG. 3 is a perspective view of a laser beam steering device according to an exemplary embodiment.

FIG. 3 is a perspective view of a laser beam steering device 100 according to an exemplary embodiment.

Referring to FIG. 3, the laser beam steering device 100 may include a plurality of unit cells P arranged in two dimensions. Since each of the unit cells P has a certain refractive index, the unit cells P may form a refractive index profile. As the unit cells P form a refractive index profile that varies according to time, a laser beam incident on the laser beam steering device 100 may be steered in a desired direction.

Figure 4:
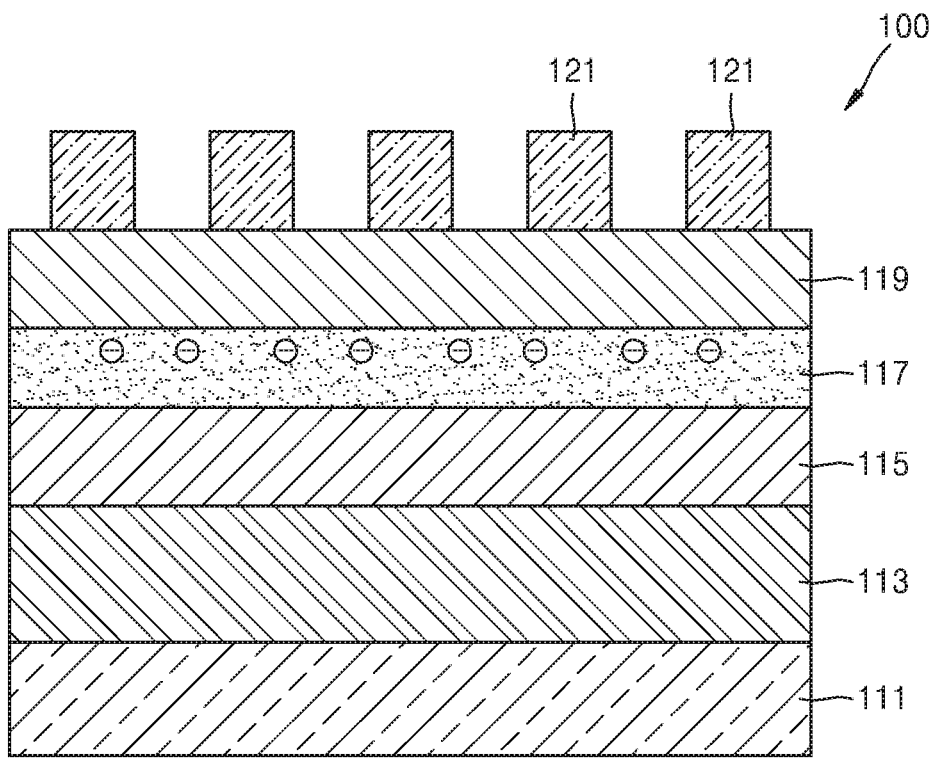
FIG. 4 is a cross-sectional view of a unit cell P of the laser beam steering device of FIG. 3.

FIG. 4 is a cross-sectional view of the unit cell P of the laser beam steering device 100 of FIG. 3.

Referring to FIG. 4, the unit cell P of the laser beam steering device 100 may include a refractive index change layer 117, a plurality of antenna patterns 121 arranged above the refractive index change layer 117, a wavelength selection layer 115 provided under the refractive index change layer 117, and a unit cell driving unit 111 applying an electrical signal to the refractive index change layer 117.

The carrier density of the refractive index change layer 117 may vary according to application of an electrical signal, for example, a voltage. The change of carrier density may change the refractive index of the refractive index change layer 117 so that a laser beam may be steered by the change of the refractive index.

The refractive index change layer 117 may include a material having a carrier density that varies according to an applied voltage. For example, the refractive index change layer 117 may include an oxide semiconductor. As a detailed example, the refractive index change layer 117 may include a transparent conductive oxide (TCO). The TCO may include at least one of, for example, indium-tin-oxide (ITO), indium-zinc-oxide (IZO), Ga—In—Zn-oxide (GIZO), Al—Zn-oxide (AZO), Ga—Zn-oxide (GZO), and ZnO. However, the present exemplary embodiment is not limited thereto.

In general, since the refractive index change efficiency is improved as the carrier density increases, the refractive index change layer 117 may have a material having a high carrier density. As such, when the refractive index change layer 117 has a high carrier density, the refractive index change efficiency is improved and thus the maximum phase of a laser beam may be increased.

The refractive index change layer 117 may have a relatively thin thickness not to affect the wavelength of an incident laser beam. For example, the refractive index change layer 117 may have a thickness of about 5 nm or less. However, the thickness of the refractive index change layer 117 is not limited thereto and the refractive index change layer 117 may have various other thicknesses.

The antenna patterns 121 are provided above the refractive index change layer 117. FIG. 4 exemplarily illustrates a case in which five antenna patterns are provided corresponding to a single unit cell P. However, the present exemplary embodiment is not limited thereto and various numbers of the antenna patterns 121 may be provided corresponding to a single unit cell P.

The antenna patterns 121 form a metasurface to perform a beam steering. The antenna patterns 121 may include, for example, metal or an alloy including at least one of Ag, Au, Al, and Pt. Furthermore, the antenna patterns 121 may include a metal nitride such as TiN or TaN. Since the above-mentioned materials are exemplary, the antenna patterns 121 may include various other materials.

According to the exemplary embodiment, two active layers (e.g., the wavelength selection layer 115 and the refractive index change layer 117) are provided in the laser beam steering device 100. The laser beam steering device 100 may change the movement of a laser beam which is incident onto the laser beam steering device 100. Between the two active layers, a first active layer which is disposed closer to the insulation layer 119 in comparison with a second active layer (e.g., the refractive index change layer 117) may change its carrier density according to a voltage level applied to the first active layer. To this end, the first active layer may be formed of a material having a refractive index change efficiency higher than a refractive index change efficiency of the second active layer. The second active layer (e.g., the wavelength selection layer 115) may have a carrier density or an impurity concentration which reacts to the wavelength of the laser beam. Since the second active layer provides a wide range of available wavelengths while the first active layer provides a high refractive index change efficiency, the steering efficiency of the device 100 may be improved.

FIG. 3 illustrates a case in which the antenna patterns 121 are arranged in a regular interval and have a rectangular shape. However, the present exemplary embodiment is not limited thereto and the antenna patterns 121 may have various shapes. For example, the antenna patterns 121 may have a polygonal shape including a circle, an oval, a triangle, or a rectangle. Furthermore, the antenna patterns 121 may have an irregular shape.

The interval between the antenna patterns 121 may be, for example, less than ½ or ⅓ of the wavelength of an incident laser beam. For example, when the wavelength of an incident laser beam is about 1500 nm, the interval between the antenna patterns 121 may be equal to or less than about 500 nm. However, the present exemplary embodiment is not limited thereto. Although the antenna patterns 121 may be arranged in a regular interval, the present exemplary embodiment is not limited thereto and the antenna patterns 121 may be arranged in an irregular interval.

The insulating layer 119 may be provided between the refractive index change layer 117 and the antenna patterns 121. The insulating layer 119 may include an insulating material of various types. For example, the insulating layer 119 may include an insulating material having resistance of about 1 MΩ or more. As a detailed example, although the insulating layer 119 may include a silicon oxide, a silicon nitride, $Al_2O_3$, $ZrO_2$, or $HfO_2$, the present disclosure is not limited thereto.

The wavelength selection layer 115 may be disposed on a lower surface of the refractive index change layer 117. The wavelength selection layer 115 may be provided in the laser beam steering device 100 to correspond to the wavelength of an incident laser beam. In detail, the wavelength selection layer 115 may include a material having a carrier density corresponding to the resonance wavelength of a laser beam.

The wavelength selection layer 115 may include, for example, oxide semiconductor. As a detailed example, the wavelength selection layer 115 may include TCO. The TCO may include, for example, at least one of ITO, IZO, GIZO, AZO, GZO, and ZnO, the present disclosure is not limited thereto.

The wavelength selection layer 115 and the refractive index change layer 117 may have the same composition but different carrier densities. For example, although both the refractive index change layer 117 and the wavelength selection layer 115 may include ITO, the wavelength selection layer 115 may have a carrier density different from the refractive index change layer 117. The wavelength selection layer 115 may have, for example, a carrier density smaller than that of the refractive index change layer 117, but the present exemplary embodiment is not limited thereto. The wavelength selection layer 115 may include a composition other than that of the refractive index change layer 117. For example, when the refractive index change layer 117 includes ITO, the wavelength selection layer 115 may be formed of IZO. Since the wavelength selection layer 115 determines the wavelength of a laser beam, the refractive index change layer 117 provided on an upper surface of the wavelength selection layer 115 may have a thin thickness of, for example, about 5 nm or less, in order not to affect the wavelength of a laser beam.

A metal mirror layer 113 may be provided on a lower surface of the wavelength selection layer 115. As the metal mirror layer 113 reflects the incident laser beam, an optical efficiency of the laser beam steering device 100 may be improved. The metal mirror layer 113 may include, for example, the same metal material as the antenna patterns 121. As a detailed example, the metal mirror layer 113 may include at least one of Ag, Au, Al, and Pt. However, the present exemplary embodiment is not limited thereto and the metal mirror layer 113 may include a metal material different from the antenna patterns 121.

The metal mirror layer 113 may also function as an electrode to apply a voltage to the refractive index change layer 117. For example, when the unit cell driving unit 111 applies a voltage between the metal mirror layer 113 and the antenna patterns 121, the carrier density and the refractive index of the refractive index change layer 117 may change.

The unit cell driving unit 111 may apply an electrical signal such as a voltage to the refractive index change layer 117. The unit cell driving unit 111 may be provided under the metal mirror layer 113. The unit cell driving unit 111 is configured to include, for example, one transistor and one capacitor, thereby applying a voltage to the refractive index change layer 117 in the unit cell P. The unit cell driving unit 111 may apply a voltage between the antenna patterns 121 and the metal mirror layer 113 or between the antenna patterns 121 and the refractive index change layer 117.

Since the unit cells P are independently driven by the unit cell driving units 111 corresponding thereto, different refractive indexes occur and thus the unit cells P may form a refractive index profile. As the refractive index profile may be changed according to the voltage applied to the unit cells P, the laser beam may be steered in a desired direction.

In the laser beam steering device 100 configured as above, since a high refractive index change efficiency is implemented by the refractive index change layer 117, the maximum phase may be secured and a laser beam of various wavelength ranges may be used by the wavelength selection layer 115.

In the general laser beam steering device 10 of FIG. 1, as the carrier density of the refractive index change layer 17 increases, the refractive index change efficiency increases and thus the maximum phase is secured. However, when the carrier density of the refractive index change layer 17 increases, the resonance wavelength of a laser beam decreases. When a laser beam having a long resonance wavelength of, for example, 1.5 μm or more, is in use, it is difficult to secure a high phase. In the present exemplary embodiment, since the laser beam steering device 100 includes the refractive index change layer 117 and the wavelength selection layer 115, a laser beam of various wavelength ranges may be used and the maximum phase may be secured. In detail, as the refractive index change layer 117 is configured to have a high carrier density, the refractive index change efficiency may be improved and thus the maximum phase may be secured. Furthermore, as the wavelength selection layer 115 is configured to have a carrier density corresponding to the resonance wavelength of a laser beam, a laser beam of various wavelength ranges may be used. Accordingly, while a laser beam of various wavelength ranges is in use, the maximum phase may be secured. For example, while a laser beam having a long resonance wavelength of about 1.5 μm or more is in use, the maximum phase may be secured. Furthermore, as described below, according to the present exemplary embodiment, the maximum phase may be secured at a lower driving voltage in the laser beam steering device 100.

Figure 5:
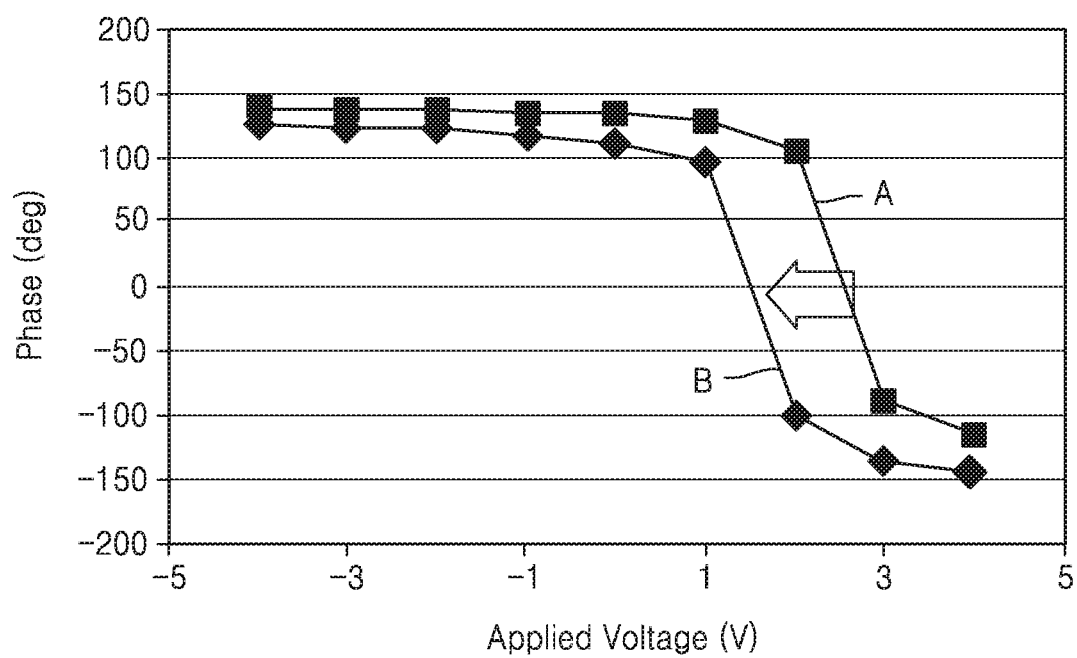
FIG. 5 is a graph of a finite difference time domain (FDTD) simulation result showing a phase according to an applied voltage, in a general laser beam steering device A and a laser beam steering device B according to an exemplary embodiment.

FIG. 5 is a graph of a finite difference time domain (FDTD) simulation result showing a phase according to an applied voltage, in a general laser beam steering device A and a laser beam steering device B according to an exemplary embodiment. In FIG. 5, the general laser beam steering device A has a sectional structure of FIG. 1, whereas the laser beam steering device B according to the present exemplary embodiment has the sectional structure of FIG. 3. While ITO having a carrier density of about $5.5E20/cm^3$ is used for the refractive index change layer 17 in the general laser beam steering device A, ITO having a carrier density of about $1E21/cm^3$ is used for the refractive index change layer 117 and ITO having a carrier density of about $5.5E20/cm^3$ is used for the wavelength selection layer 115 in the laser beam steering device B according to the present exemplary embodiment. This applies to the following description.

Referring to FIG. 5, it may be seen that the laser beam steering device B according to the present exemplary embodiment may secure a relatively high phase with a relatively low applied voltage compared to the general laser beam steering device A. Accordingly, the laser beam steering device B according to the present exemplary embodiment may implement a relatively high phase with a relatively low driving voltage.

Figure 6A:
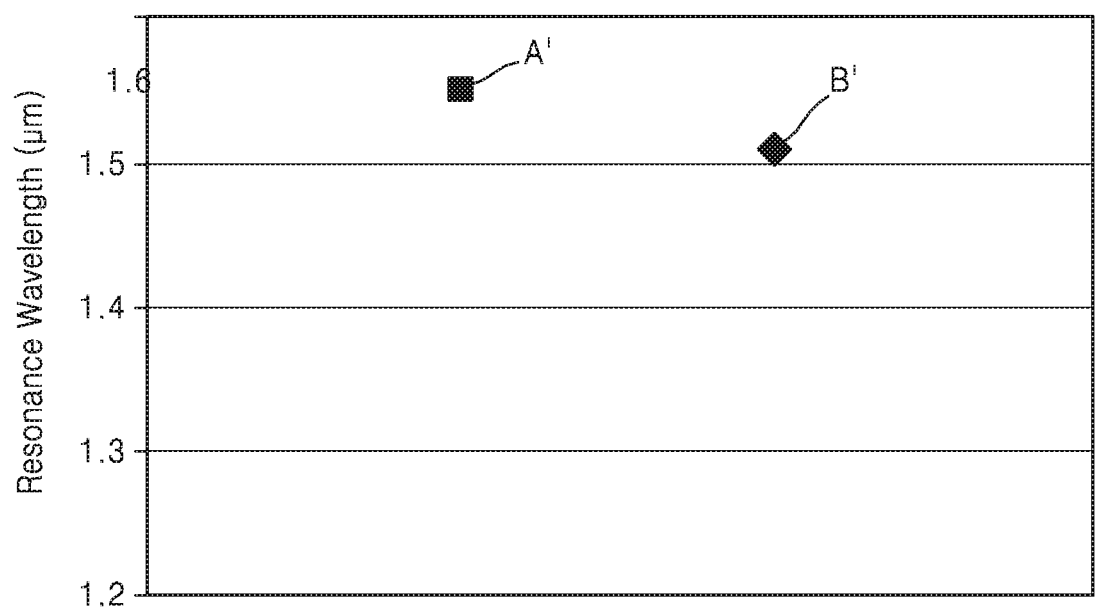
FIG. 6A is a graph of a FDTD simulation result showing a resonance wavelength of a laser beam, in the general laser beam steering device A' and the laser beam steering device B' according to the present exemplary embodiment.
Figure 6B:
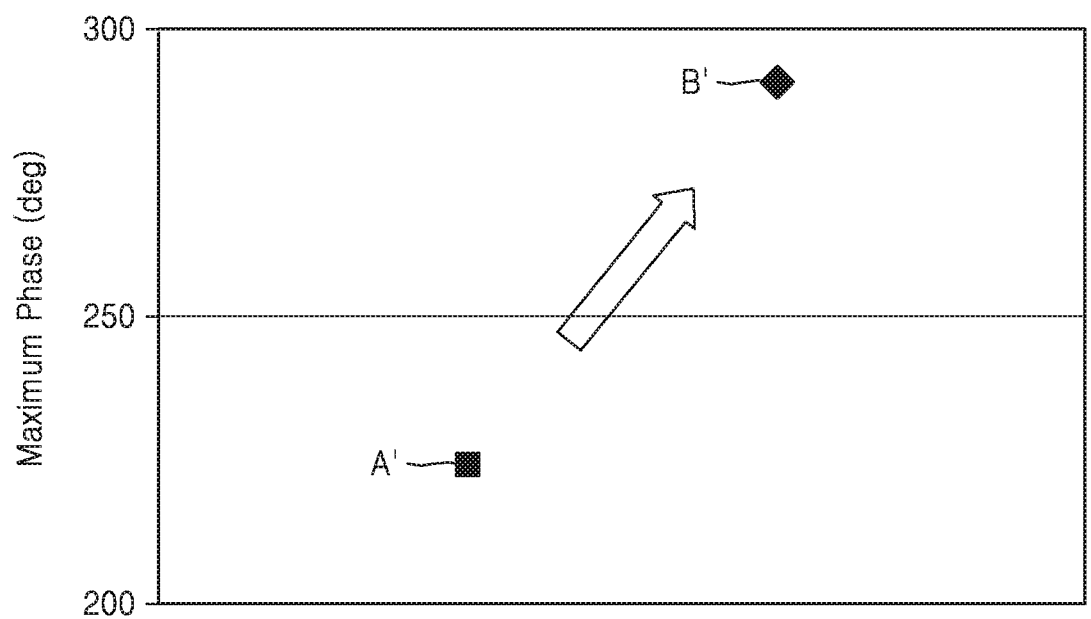
FIG. 6B is a graph of a FDTD simulation result showing the maximum phase of a laser beam, in the general laser beam steering device A' and the laser beam steering device B' according to the present exemplary embodiment.

FIG. 6A is a graph of a FDTD simulation result showing a resonance wavelength of a laser beam, in the general laser beam steering device A' and the laser beam steering device B' according to the present exemplary embodiment. FIG. 6B is a graph of a FDTD simulation result showing the maximum phase of a laser beam, in the general laser beam steering device A' and the laser beam steering device B' according to the present exemplary embodiment. In FIGS. 6A and 6B, the general laser beam steering device A' has a sectional structure of FIG. 1, and the laser beam steering device B' according to the present exemplary embodiment has a sectional structure of FIG. 4.

FIGS. 6A and 6B show results when the wavelength selection layer 115 of the laser beam steering device B' according to the present exemplary embodiment is formed of ITO having the same carrier density ($1E20/cm^3$) as the refractive index change layer 17 of the general laser beam steering device A' and the refraction change layer 117 of the laser beam steering device B according to the present exemplary embodiment is formed of ITO having a higher carrier density ($1E21/cm^3$) than the wavelength selection layer 115.

Referring to FIG. 6A, it may be seen that the resonance wavelengths of laser beams are maintained to be almost similar to each other in the general laser beam steering device A' and the laser beam steering device B' according to the present exemplary embodiment. Furthermore, referring to FIG. 6B, it may be seen that, although the maximum phase is about 220 degrees in the general laser beam steering device A', the maximum phase may be about 291 degrees the laser beam steering device B' according to the present exemplary embodiment. Accordingly, the laser beam steering device B' according to the present exemplary embodiment may secure a higher maximum phase than the general laser beam steering device A'.

Figure 7A:
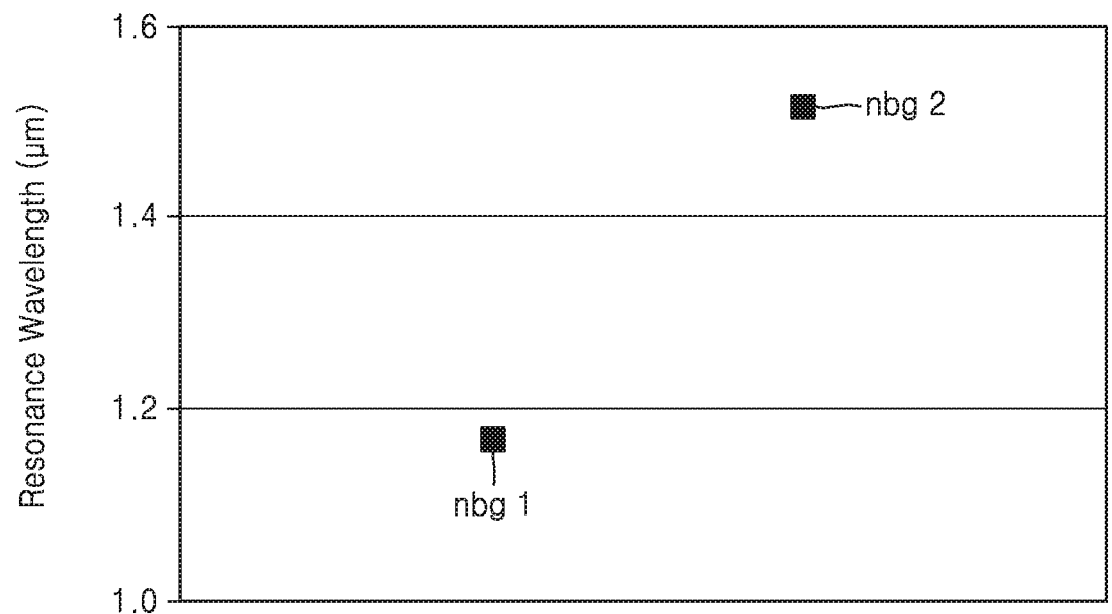
FIG. 7A is a graph of a FDTD simulation result showing a change in the resonance wavelength according to a change in the carrier density, in a laser beam steering device according to an exemplary embodiment.
Figure 7B:
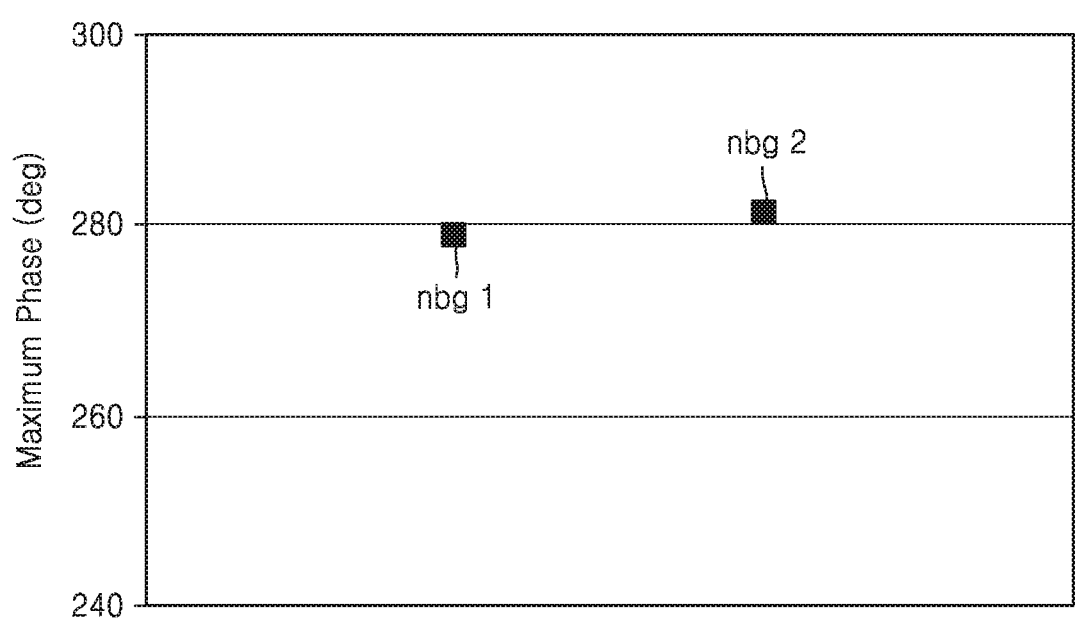
FIG. 7B is a graph of a FDTD simulation result showing the maximum phase according to a change in the carrier density, in a laser beam steering device according to an exemplary embodiment.

FIG. 7A is a graph of a FDTD simulation result showing a change in the resonance wavelength according to a change in the carrier density, in a laser beam steering device according to an exemplary embodiment. FIG. 7B is a graph of a FDTD simulation result showing the maximum phase according to a change in the carrier density, in a laser beam steering device according to an exemplary embodiment. FIGS. 7A and 7B illustrate results when the carrier density of the wavelength selection layer 115 in the laser beam steering device 100 according to the present exemplary embodiment is changed.

Referring to FIG. 7A, it may be seen that the resonance wavelength changes corresponding to a change in the carrier density of the wavelength selection layer 115. In detail, it may be seen that, as the carrier density decreases from nbg1 ($5.5E20/cm^3$) to nbg2 ($1E20/cm^3$), the resonance wavelength increases. Furthermore, referring to FIG. 7B, it may be seen that the maximum phase hardly changes even when the carrier density of the wavelength selection layer 115. In detail, it may be seen that the maximum phase is maintained almost the same even when the carrier density decreases from nbg1 ($5.5E20/cm^3$) to nbg2 ($1E20/cm^3$). Accordingly, the laser beam steering device 100 according to the present exemplary embodiment may use a laser beam of various resonance wavelength ranges while maintaining the maximum phase.

Figure 8:
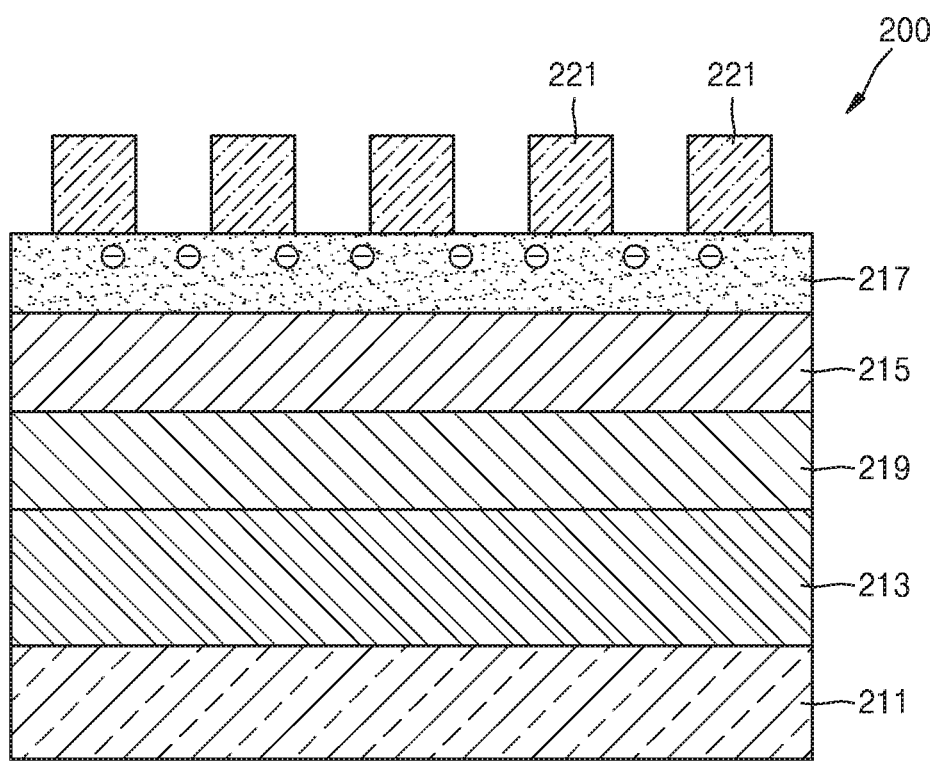
FIG. 8 is a cross-sectional view of a laser beam steering device according to another exemplary embodiment.

FIG. 8 is a cross-sectional view of a laser beam steering device 200 according to another exemplary embodiment.

FIG. 8 illustrates one of a plurality of unit cells forming the laser beam steering device 200.

Referring to FIG. 8, the laser beam steering device 200 may include a plurality of antenna patterns 221, a refractive index change layer 217, a wavelength selection layer 215, an insulating layer 219, a metal mirror layer 213, and a unit cell driving unit 211. The plurality of antenna patterns 221 may be disposed on an upper surface of the refractive index change layer 217. A carrier density of the refractive index change layer 217 is changed by an electrical signal. The wavelength selection layer 215 may be disposed on a lower surface of the refractive index change layer 217. The insulating layer 219 may be disposed on a lower surface of the wavelength selection layer 215. A unit cell driving unit 211 that applies an electrical signal to the refractive index change layer 217 may be disposed under the insulating layer 219. A metal mirror layer 213 may be disposed between the insulating layer 219 and the unit cell driving unit 211. The metal mirror layer 213 may function as an electrode to apply a voltage to the refractive index change layer 217.

The unit cell driving unit 211 may apply a voltage between the antenna patterns 221 and the metal mirror layer 213 or between the metal mirror layer 213 and the refractive index change layer 217, thereby controlling the carrier density of the refractive index change layer 217.

In the laser beam steering device 200 configured as described above, since the refractive index change layer 217 is configured to have a high carrier density, the refractive index change efficiency may be improved and the maximum phase may be secured. Furthermore, as the wavelength selection layer 215 is configured to have a carrier density corresponding to the resonance wavelength of a laser beam, a laser beam of various wavelength ranges may be used. Accordingly, while a laser beam of various wavelength ranges is used, the maximum phase may be secured. The maximum phase may be secured at a low driving voltage.

Figure 9:
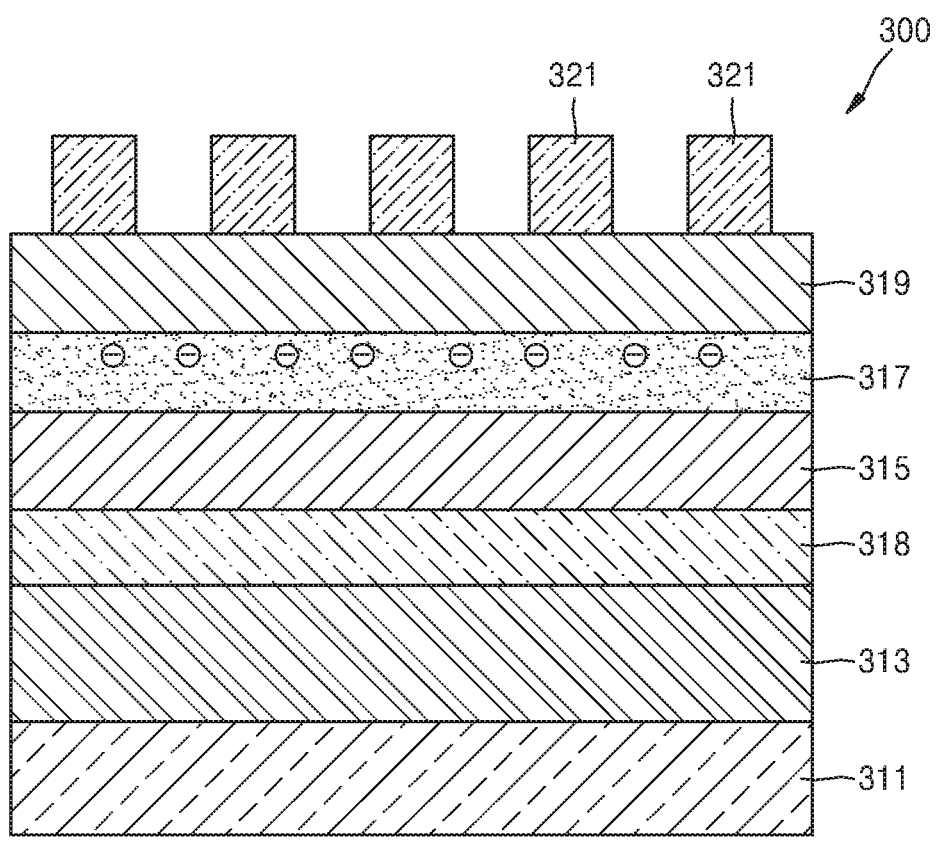
FIG. 9 is a cross-sectional view of a laser beam steering device according to another exemplary embodiment.

FIG. 9 is a cross-sectional view of a laser beam steering device 300 according to another exemplary embodiment. FIG. 9 illustrates one of a plurality of unit cells forming the laser beam steering device 300.

Referring to FIG. 9, the laser beam steering device 300 includes a plurality of antenna patterns 321, a first insulating layer 319, a refractive index change layer 317, a wavelength selection layer 315, a second insulating layer 318, a metal mirror layer 313, and a unit cell driving unit 311. The first insulating layer 319 may be disposed on an upper surface of a refractive index change layer 317. A carrier density of the refractive index change layer 317 may be changed by an electrical signal. The plurality of antenna patterns 321 may be disposed on an upper surface of the first insulating layer 319. The wavelength selection layer 315 may be provided on a lower surface of the refractive index change layer 317. Thus, the wavelength selection layer 315 may be disposed between the refractive index change layer 317 and the second insulating layer 318. The second insulating layer 318 may be disposed on a lower surface of the wavelength selection layer 315 and an upper surface of the metal mirror layer 313. The unit cell driving unit 311 may apply an electrical signal to the refractive index change layer 317 and may be disposed under the metal mirror layer 313. The metal mirror layer 313 may be disposed between the second insulating layer 318 and the unit cell driving unit 311.

The first and second insulating layers 319 and 318 may include an insulating material having resistance of, for example, about 1 MΩ or more, for example, a silicon oxide, a silicon nitride, $Al_2O_3$, $ZrO_2$, or $HfO_2$, the present disclosure is not limited thereto.

As the unit cell driving unit 311 applies a voltage between the antenna patterns 321 and the metal mirror layer 313 or between the refractive index change layer 317 and the metal mirror layer 313, the carrier density of the refractive index change layer 317 may be changed.

In the laser beam steering device 300 configured as described above, while a laser beam of various wavelength ranges is used, the maximum phase may be secured. Accordingly, the maximum phase may be secured at a low driving voltage.

Figure 10:
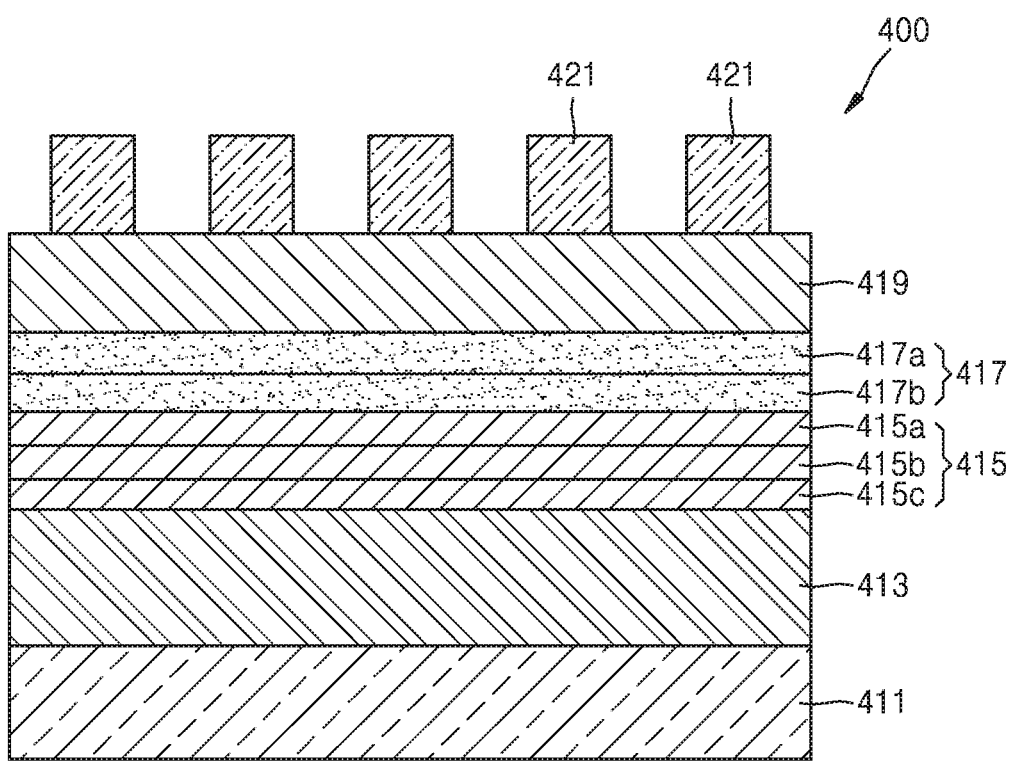
FIG. 10 is a cross-sectional view of a laser beam steering device according to another exemplary embodiment.

FIG. 10 is a cross-sectional view of a laser beam steering device 400 according to another exemplary embodiment. FIG. 10 illustrates one of a plurality of unit cells forming the laser beam steering device 400.

Referring to FIG. 10, an insulting layer 419 may be provided on an upper surface of a refractive index change layer 417 in which a carrier density is changed by an electrical signal. A plurality of antenna patterns 421 may be provided on an upper surface of the insulating layer.

The refractive index change layer 417 has a refractive index that varies according to an electrical signal, and has a multilayer structure. For example, the refractive index change layer 417 may include the first and second change layers 417a and 417b that are vertically stacked. The first and second change layers 417a and 417b may include a material having a carrier density that varies according to an electrical signal. For example, the first and second change layers 417a and 417b may include oxide semiconductor such as TCO.

The first and second change layers 417a and 417b may have a carrier density that may implement a high refractive index change efficiency. Although the first and second change layers 417a and 417b may have, for example, similar carrier densities, the present exemplary embodiment is not limited thereto. FIG. 10 exemplarily illustrates a case in which the refractive index change layer 417 includes two layers. Alternatively, the refractive index change layer 417 may include three or more layers. The refractive index change layer 417 having the first and second change layers 417a and 417b may have a relatively thin thickness that does not affect the wavelength of a laser beam.

The wavelength selection layer 415 is provided on a lower surface of the refractive index change layer 417. The wavelength selection layer 415 is provided corresponding to the wavelength of a laser beam and may have a multilayer structure. For example, the wavelength selection layer 415 may include first, second, and third selection layers 415a, 415b, and 415c that are vertically stacked. For example, the first, second, and third selection layers 415a, 415b, and 415c may include oxide semiconductor such as TCO.

The first, second, and third selection layers 415a, 415b, and 415c may have a carrier density corresponding to the resonance wavelength of a laser beam. Although the first, second, and third selection layers 415a, 415b, and 415c may have, for example, similar carrier densities, the exemplary embodiment is not limited thereto. FIG. 10 exemplarily illustrates a case in which the wavelength selection layer 415 includes three layers, the wavelength selection layer 415 may include two or four or more layers.

A unit cell driving unit 411 that applies an electric signal to the refractive index change layer 417 may be provided under the wavelength selection layer 415. A metal mirror layer 413 may be provided between the wavelength selection layer 415 and the unit cell driving unit 411.

In the present exemplary embodiment, each of the refractive index change layer 417 and the wavelength selection layer 415 includes a plurality of layers. In the laser beam steering device 400 configured as above, while a laser beam of various wavelength ranges is used, the maximum phase may be secured. Accordingly, the maximum phase may be secured at a low driving voltage. Although in the above description, each of the refractive index change layer 417 and the wavelength selection layer 415 includes a plurality of layers, the refractive index change layer 417 may have a single layer structure and the wavelength selection layer 415 may have a multilayer structure. Furthermore, while the refractive index change layer 417 has a multilayer structure, the wavelength selection layer 415 may have a single layer structure.

Figure 11:
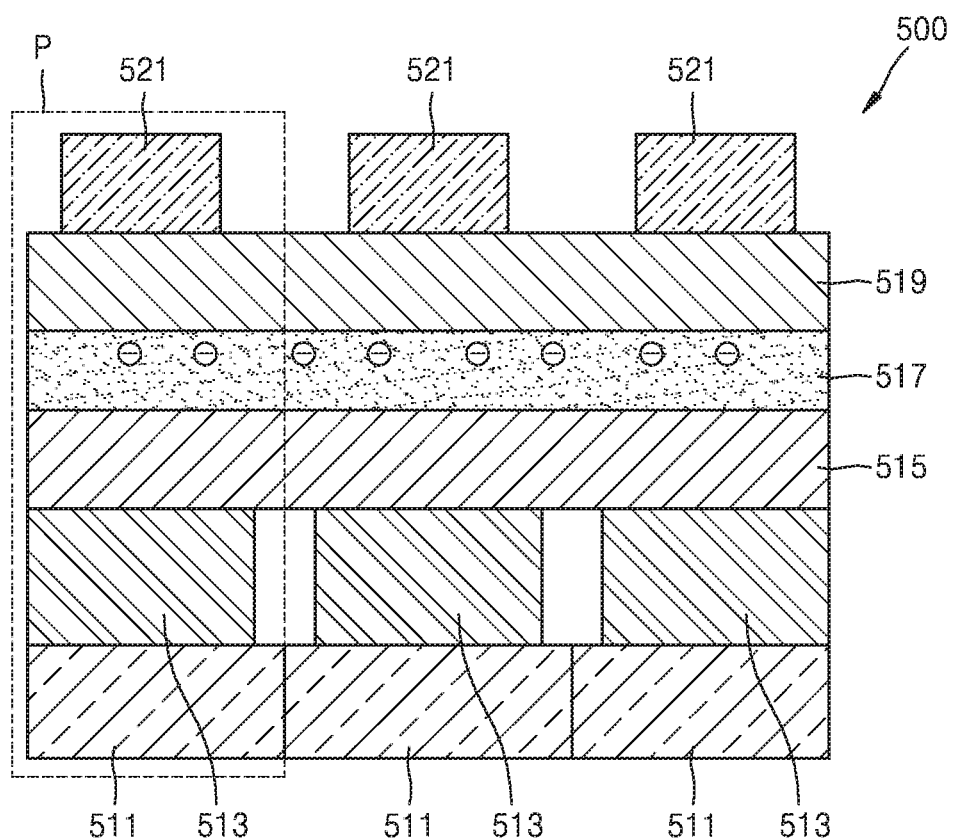
FIG. 11 is a cross-sectional view of a laser beam steering device according to another exemplary embodiment.

FIG. 11 is a cross-sectional view of a laser beam steering device 500 according to another exemplary embodiment. FIG. 11 illustrates three unit cells P of a plurality of unit cells P forming the laser beam steering device 500.

Referring to FIG. 11, in the unit cell P of the laser beam steering device 500, an insulating layer 519 may be provided on an upper surface of a refractive index change layer 517 in which a carrier density is changed by an electrical signal. An antenna pattern 521 may be provided on an upper surface of the insulating layer 519. Although FIG. 11 exemplarily illustrates a case in which the refractive index change layer 517 is formed in a single layer, the refractive index change layer 517 may have a multilayer structure.

The wavelength selection layer 515 may be provided on a lower surface of the refractive index change layer 517. Although FIG. 11 exemplarily illustrates a case in which the wavelength selection layer 515 is formed in a single layer, the wavelength selection layer 515 may have a multilayer structure. A unit cell driving unit 515 that applies an electric signal to the refractive index change layer 517 may be provided under the wavelength selection layer 515. A metal mirror layer 513 may be provided between the wavelength selection layer 515 and the unit cell driving unit 511. The metal mirror layer 513 may include a plurality of portions which has a gap therebetween. Accordingly, the portions of the metal mirror layer 513 are spaced apart from each other.

Although the insulating layer 519 is provided between the antenna pattern 521 and the refractive index change layer 517 in the above description, the exemplary embodiment is not limited thereto and the insulating layer 519 may be provided between the metal mirror layer 513 and the wavelength selection layer 515. Furthermore, the insulating layer 519 may be provided between the antenna pattern 521 and the refractive index change layer 517, and between the metal mirror layer 513 and the wavelength selection layer 515.

In the present exemplary embodiment, the unit cell P and the antenna pattern 521 may be provided in one-to-one correspondence. Since the unit cells P forming the laser beam steering device 500 are independently driven by the unit cell driving units 511, the unit cells P have different refractive indexes and thus the unit cells P may form a refractive index profile. The refractive index profile may be changed by changing a voltage applied to the unit cells P. Accordingly, a laser beam may be steered in a desired direction.

According to the present exemplary embodiment, while a laser beam of various wavelength ranges is used in the laser beam steering device 500, the maximum phase may be secured. Accordingly, the maximum phase may be secured at a low driving voltage.

Figure 12:
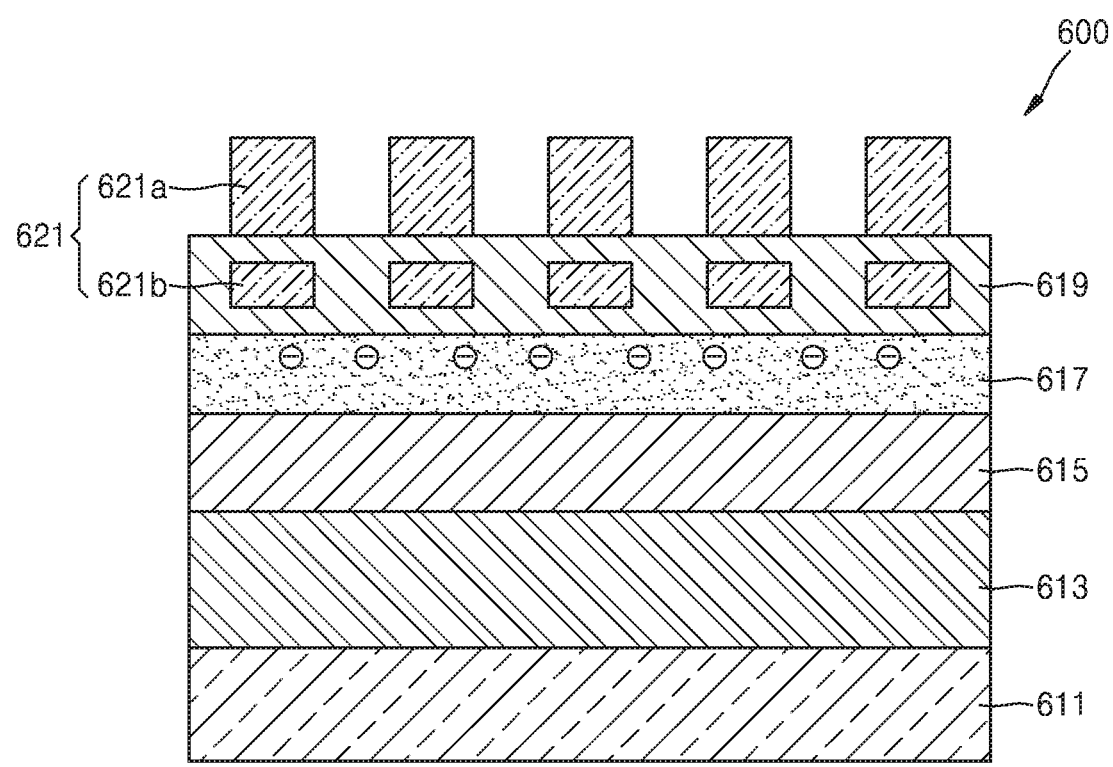
FIG. 12 is a cross-sectional view of a laser beam steering device according to another exemplary embodiment.

FIG. 12 is a cross-sectional view of a laser beam steering device 600 according to another exemplary embodiment; FIG. 12 illustrates one unit cell of a plurality of unit cells forming the laser beam steering device 600.

Referring to FIG. 12, an insulating layer 619 may be provided on an upper surface of a refractive index change layer 617 in which a carrier density is changed by an electrical signal.

The antenna patterns 621 are provided above the refractive index change layer 617. In the above-described exemplary embodiments, each of the antenna patterns 621 may have a vertically stacked multilayer structure. As such, when the antenna patterns 621 are formed in multiple layers, directionality may be improved so that the amount of light a laser beam steered in a particular direction may be increased.

Each of the antenna patterns 621 may include, for example, an upper antenna pattern 621a disposed on the insulating layer 619, and a lower antenna pattern 621b disposed inside the insulating layer 619. FIG. 12 exemplarily illustrates a case in which each of the antenna patterns 621 has vertically stacked two layers, that is, the upper and lower antenna patterns 621a and 621b. Each of the antenna patterns 621 may include three layers or more. In this case, a lower antenna pattern may have a vertically stacked multilayer structure inside the insulating layer 619.

The antenna patterns 621 may include, for example, metal or an alloy including at least one of Ag, Au, Al, and Pt. Furthermore, the antenna patterns 621 may include metal nitride such as TiN or TaN.

The upper and lower antenna patterns 621a and 621b may have various shapes. For example, the upper and lower antenna patterns 621a and 621b may have a polygonal shape including a circle, an oval, a triangle, or a rectangle. Furthermore, the upper and lower antenna patterns 621a and 621b may have an irregular shape. Although the upper and lower antenna patterns 621a and 621b may be arranged in a regular interval, the exemplary embodiment is not limited thereto and the upper and lower antenna patterns 621a and 621b may be arranged in an irregular interval.

A wavelength selection layer 615 may be disposed on a lower surface of the refractive index change layer 617. A unit cell driving unit 611 that applies an electrical signal to the refractive index change layer 617 may be disposed under the wavelength selection layer 615. A metal mirror layer 613 may be disposed between the wavelength selection layer 615 and the unit cell driving unit 611.

According to the present exemplary embodiment, in the laser beam steering device 600, since each of the antenna patterns 621 has a multilayer structure, directionality may be improved. Furthermore, while a laser beam of various wavelength ranges is used, the maximum phase may be secured. Accordingly, the maximum phase may be secured at a low driving voltage.

Figure 13:
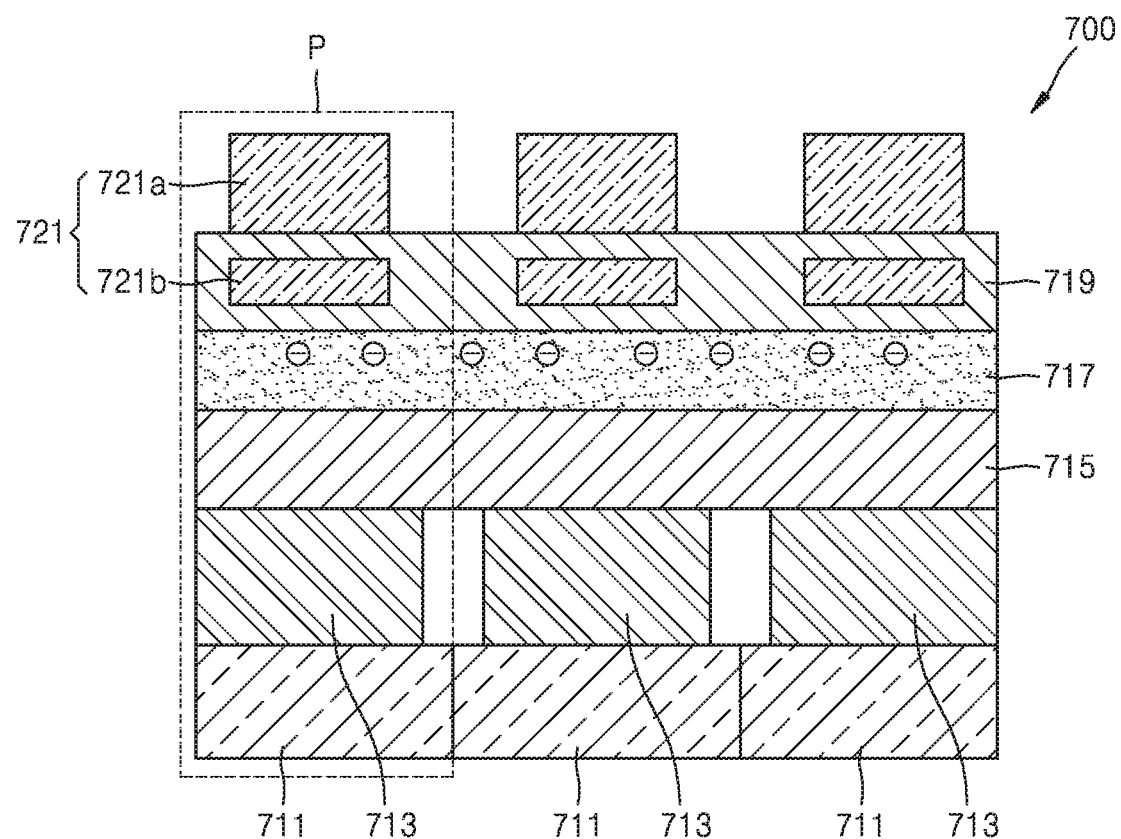
FIG. 13 is a cross-sectional view of a laser beam steering device according to another exemplary embodiment.

FIG. 13 is a cross-sectional view of a laser beam steering device 700 according to another exemplary embodiment. FIG. 13 illustrates three unit cells P of a plurality of unit cells P forming the laser beam steering device 700.

Referring to FIG. 13, in the unit cell P of the laser beam steering device 700, an insulating layer 719 may be disposed on an upper surface of a refractive index change layer 717 in which a carrier density is changed by an electrical signal. An antenna pattern 721 may be disposed on the refractive index change layer 717. In the exemplary embodiment, the antenna pattern 721 has a vertically stacked multilayer structure to improve directionality.

The antenna pattern 721 may include upper antenna pattern 721a disposed on the insulating layer 719, and a lower antenna pattern 721b disposed inside the insulating layer 719. FIG. 13 exemplarily illustrates a case in which the antenna pattern 721 includes vertically stacked two layers, that is, the upper and lower antenna patterns 721a and 721b. Alternatively, the antenna pattern 721 may include three or more layers. A wavelength selection layer 715 may be provided on a lower surface of the refractive index change layer 717. A unit cell driving unit 711 may be provided under the wavelength selection layer 715. A metal mirror layer 713 may be provided between the wavelength selection layer 715 and the unit cell driving unit 711.

In the exemplary embodiment, a pair of antenna patterns 721 including the upper and lower antenna patterns 721a and 721b is provided corresponding to one unit cell P. As such, since the antenna pattern 721 has a multilayer structure, directionality may be improved. Furthermore, while a laser beam of various wavelength ranges is used, the maximum phase may be secured. Accordingly, the maximum phase may be secured at a low driving voltage.

Figure 14:
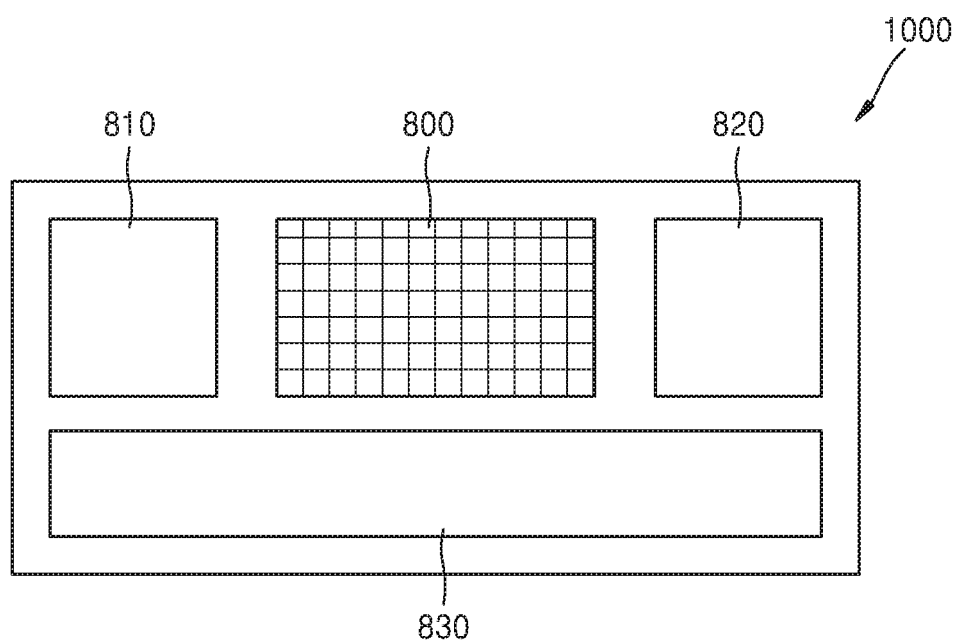
FIG. 14 illustrates a system according to another exemplary embodiment.

FIG. 14 illustrates a system 1000 according to another exemplary embodiment. FIG. 14 schematically illustrates the system 1000 adopting any of the laser beam steering devices according to above-described embodiments.

Referring to FIG. 14, according to an exemplary embodiment the system 1000 may include a laser light source 810 emitting a laser beam to an object, a laser beam steering device 800 steering the laser beam, a detector 820 detecting a laser beam reflected from the object, and an operating driver 830. The operating driver 830 may include driving circuits for driving the laser light source 810, the laser beam steering device 800, and the detector 820.

A laser diode, for example, may be used as the laser light source 810. However, this is merely exemplary and various other light sources may be used therefor. A laser beam emitted from the laser light source 810 is incident upon the laser beam steering device 800. The laser beam steering device 800 steers an incident laser beam to a desired position. The laser beam steering device 800 may include any of the laser beam steering devices 100, 200, 300, 400, 500, 600, and 700 according to the above-described embodiments. When the laser beam steered by the laser beam steering device 800 is irradiated to an object and reflected therefrom, the detector 820 may detect the reflected laser beam. The system 1000 employing the laser beam steering device 800 as above may be applied to various fields such as a depth sensor, a 3D sensor, and a light detection and ranging (LiDAR).

As described above, according to the above-described exemplary embodiments, since the laser beam steering device includes the refractive index change layer and the wavelength selection layer, while a laser beam of various wavelength ranges is used, the maximum phase may be secured. In other words, since the refractive index change layer is configured to have a high carrier density, a high refractive index change efficiency may be implemented and thus the maximum phase may be secured. Furthermore, since the wavelength selection layer is configured to have a carrier density corresponding to the resonance wavelength of a laser beam, a laser beam of various wavelength ranges may be used. Furthermore, in the laser beam steering devices according to the above-described exemplary embodiments, the maximum phase may be secured at a lower driving voltage.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A laser beam steering device comprising:
   a refractive index change layer having a refractive index that changes based on a voltage of an electrical signal;
   at least one antenna pattern disposed above the refractive index change layer;
   a wavelength selection layer disposed under the refractive index change layer and having a carrier density that reacts to a resonance wavelength of a laser beam incident onto the laser beam steering device; and
   a driver configured to apply the voltage to the refractive index change layer to change the refractive index of the refractive index change layer,
   wherein the carrier density of the wavelength selection layer that reacts to the resonance wavelength of the laser beam is different from a carrier density of the refractive index change layer that is disposed between the at least one antenna pattern and the wavelength selection layer.

2. The laser beam steering device of claim 1, wherein the wavelength selection layer has a same composition as the refractive index change layer.

3. The laser beam steering device of claim 1, wherein a refractive index chance efficiency of the refractive index change is higher than a refractive index change efficiency of the wavelength selection layer.

4. The laser beam steering device of claim 1, wherein a thickness of the refractive index change layer is smaller than a thickness of the wavelength selection layer.

5. The laser beam steering device of claim 1, wherein the wavelength selection layer has a composition different from a composition of the refractive index change layer.

6. The laser beam steering device of claim 1, wherein the refractive index change layer has a single layer structure or a multilayer structure.

7. The laser beam steering device of claim 1, wherein the wavelength selection layer has a single layer structure or a multilayer structure.

8. The laser beam steering device of claim 1, wherein the refractive index change layer and the wavelength selection layer comprise oxide semiconductor.

9. The laser beam steering device of claim 8, wherein the oxide semiconductor comprises at least one of indium-tin-oxide (ITO), indium-zinc-oxide (IZO), Ga—In—Zn-oxide (GIZO), Al—Zn-oxide (AZO), Ga—Zn-oxide (GZO), and ZnO ITO(Indium-Tin-Oxide), IZO(Indium-Zinc-Oxide), GIZO(Ga—In—Zn-Oxide), AZO(Al—Zn-Oxide), GZO (Ga—Zn-Oxide), and ZnO.

10. The laser beam steering device of claim 1, wherein the refractive index change layer has a thickness of about 5 nm or less.

11. The laser beam steering device of claim 1, further comprising an insulating layer that is disposed between the refractive index change layer and the at least one antenna pattern.

12. The laser beam steering device of claim 11, wherein the insulating layer comprises a material having resistance of about 1 MΩ or more.

13. The laser beam steering device of claim 1, further comprising a metal mirror layer that is disposed under the wavelength selection layer.

14. The laser beam steering device of claim 13, further comprising an insulating layer that is disposed between the wavelength selection layer and the metal mirror layer.

15. The laser beam steering device of claim 1, wherein at least one antenna pattern comprises at least one of Ag, Au, Al, Pt, TiN, and TaN.

16. The laser beam steering device of claim 1, wherein the at least one antenna pattern has a multilayer structure.

17. A laser beam steering device comprising a plurality of unit cells, each of the unit cells comprising:
    a refractive index change layer having a refractive index that changes based on a voltage of an electrical signal;
    at least one antenna pattern disposed above the refractive index change layer;
    a wavelength selection layer disposed under the refractive index change layer and having a carrier density that allows to react a resonance wavelength of a laser beam incident onto the laser beam steering device; and
    a unit cell driver configured to apply the voltage to the refractive index change layer to change the refractive index of the refractive index change layer,
    wherein the carrier density of the wavelength selection layer that reacts to the resonance wavelength of the laser beam is different from a carrier density of the refractive index change layer disposed between the at least one antenna pattern and the wavelength selection layer.

18. The laser beam steering device of claim 17, wherein the plurality of unit cells are arranged in two dimensions.

19. The laser beam steering device of claim 18, wherein the plurality of unit cells form a refractive index profile that varies according to time so that the laser beam is steered.

20. The laser beam steering device of claim 17, wherein a refractive index change efficiency of the refractive index change is higher than a refractive index change efficiency of the wavelength selection layer.

21. The laser beam steering device of claim 17, wherein a thickness of the refractive index change layer is smaller than a thickness of the wavelength selection layer.

22. The laser beam steering device of claim 17, wherein each of the refractive index change layer and the wavelength selection layer has either a single layer structure or a multilayer structure.

23. The laser beam steering device of claim 17, further comprising an insulating layer that is disposed between the refractive index change layer and the at least one antenna pattern.

24. The laser beam steering device of claim 17, further comprising a metal mirror layer that is disposed under the wavelength selection layer.

25. The laser beam steering device of claim 24, further comprising an insulating layer that is disposed between the wavelength selection layer and the metal mirror layer.

26. The laser beam steering device of claim 17, wherein the at least one antenna pattern has a multilayer structure.

27. A system comprising:
    a laser light source configured to emit a laser beam to an object;
    a laser beam steering device configured to steer the laser beam emitted from the laser light source; and
    a detector configured to detect a laser beam returning from the object,
    wherein the laser beam steering device comprises a plurality of unit cells, each of the unit cells comprising:
    a refractive index change layer having a refractive index that changes based on a voltage of an electrical signal;
    at least one antenna pattern disposed above the refractive index change layer;
    a wavelength selection layer disposed under the refractive index change layer and having a carrier density that allows to react to a resonance wavelength of the laser beam; and a unit cell driving unit applying the voltage to the refractive index change layer to change the refractive index of the refractive index change layer, wherein the carrier density of the wavelength selection layer that reacts to the resonance wavelength of the laser beam is different from a carrier density of the refractive index change layer disposed between the at least one antenna pattern and the wavelength selection layer.

28. The system of claim 27, wherein the plurality of unit cells are arranged in two dimensions and form a refractive index profile that varies according to time so that the laser beam is steered.

29. The system of claim 27, wherein a refractive index change efficiency of the refractive index change is higher than a refractive index change efficiency of the wavelength selection layer.

30. The system of claim 27, wherein a thickness of the refractive index change layer is smaller than a thickness of the wavelength selection layer.

31. The system of claim 27, wherein each of the refractive index change layer and the wavelength selection layer has either a single layer structure or a multilayer structure.

32. The system of claim 27, wherein the laser beam steering device further comprises an insulating layer that is disposed between the refractive index change layer and the at least one antenna pattern.

33. The system of claim 27, wherein the laser beam steering device further comprises a metal mirror layer that is disposed under the wavelength selection layer.

34. The system of claim 27, wherein the at least one antenna pattern has a multilayer structure.

35. A laser beam steering device comprising:

an insulation layer;

an antenna pattern disposed on an upper surface of the insulation layer;

a driver configured to generate an electrical signal;

a first active layer and a second active layer which are disposed between a lower surface of the insulation layer and the driver; wherein:

the first active layer is disposed closer to the insulation layer in comparison with the second active layer, has a carrier density higher than a carrier density of the second active layer, and changes a refractive index of the first active layer according to a voltage of the electrical signal; and the second active layer resonates at a wavelength of a laser beam which is input to the laser beam steering device.

* * * * *